(12) United States Patent
Marutani

(10) Patent No.: US 12,356,771 B2
(45) Date of Patent: Jul. 8, 2025

(54) LIGHT-EMITTING DEVICE AND DISPLAY DEVICE

(71) Applicant: NICHIA CORPORATION, Anan (JP)

(72) Inventor: Yukitoshi Marutani, Anan (JP)

(73) Assignee: NICHIA CORPORATION, Anan (JP)

( * ) Notice: Subject to any disclaimer, the term of this patent is extended or adjusted under 35 U.S.C. 154(b) by 68 days.

(21) Appl. No.: 17/832,304

(22) Filed: Jun. 3, 2022

(65) Prior Publication Data

US 2022/0302356 A1 Sep. 22, 2022

Related U.S. Application Data

(63) Continuation of application No. 16/723,857, filed on Dec. 20, 2019, now Pat. No. 11,387,392.

(30) Foreign Application Priority Data

Dec. 25, 2018 (JP) .................................. 2018-240457
Dec. 19, 2019 (JP) .................................. 2019-229616

(51) Int. Cl.
*H10H 20/857* (2025.01)
*H10H 20/851* (2025.01)
(Continued)

(52) U.S. Cl.
CPC ...... *H10H 20/8512* (2025.01); *H10H 20/854* (2025.01); *H10H 29/14* (2025.01)

(58) Field of Classification Search
CPC ..... H01L 33/502; H01L 27/153; H01L 33/56; H01L 33/20; H01L 33/50; H01L 25/167;
(Continued)

(56) References Cited

U.S. PATENT DOCUMENTS 6,281,526 B1 8/2001 Nitta et al.
7,511,311 B2 3/2009 Kususe et al.
(Continued)

FOREIGN PATENT DOCUMENTS

JP 2004-288799 A 10/2004
JP 2006-005215 A 1/2006
(Continued)

OTHER PUBLICATIONS

Non-Final Office Action on U.S. Appl. No. 16/723,857 Dtd May 19, 2021.
(Continued)

*Primary Examiner* — Bitew A Dinke
(74) *Attorney, Agent, or Firm* — Foley & Lardner LLP

(57) ABSTRACT

A display device includes: a mounting substrate; and a plurality of light-emitting devices arranged on the mounting substrate. The mounting substrate includes: a plurality of thin-film transistor (TFT) elements, and a plurality of conductive pads, each of which is connected to one of the plurality of TFT elements. Each of the plurality of light-emitting devices includes: a semiconductor stacked body, a first metallic section electrically connected to the semiconductor stacked body, and a second metallic section electrically connected to the semiconductor stacked body. The plurality of conductive pads include: a plurality of first conductive pads, each electrically connected to the first metallic section of a respective light-emitting device, and a plurality of second conductive pads, each electrically connected to the second metallic section of the respective light-emitting device. The TFT elements are disposed in regions other than underneath the first metallic sections and the second metallic sections.

14 Claims, 13 Drawing Sheets

(51) Int. Cl.
  *H10H 20/854* (2025.01)
  *H10H 29/14* (2025.01)
(58) Field of Classification Search
  CPC ..... H01L 33/62; H01L 25/0753; H01L 33/24;
    H01L 27/156; H01L 33/04; H01L 33/36;
    H01L 33/44; H01L 33/52; H10H
    20/8512; H10H 20/854; H10H 29/14;
    H10H 20/857; H10H 20/819; H10H
    20/851; H10H 20/811; H10H 20/821;
    H10H 20/83; H10H 20/84; H10H 20/852;
    H10H 29/142
  See application file for complete search history.

(56) References Cited

U.S. PATENT DOCUMENTS

| | | | |
|---|---|---|---|
| 8,237,173 B2 | 8/2012 | Nagai | |
| 8,338,844 B2 | 12/2012 | Katsuno et al. | |
| 9,035,341 B2 * | 5/2015 | Hwang | H01L 33/005 |
| | | | 257/98 |
| 9,324,919 B2 * | 4/2016 | Lee | H10H 20/8514 |
| 2003/0176042 A1 | 9/2003 | Barkhordarian | |
| 2005/0145865 A1 | 7/2005 | Okuyama et al. | |
| 2005/0281303 A1 | 12/2005 | Horio et al. | |
| 2006/0169993 A1 * | 8/2006 | Fan | H10H 29/14 |
| | | | 257/89 |
| 2006/0231852 A1 | 10/2006 | Kususe et al. | |
| 2007/0262323 A1 | 11/2007 | Sonobe et al. | |
| 2009/0072267 A1 * | 3/2009 | Goshonoo | H10H 29/10 |
| | | | 257/E33.001 |
| 2010/0051975 A1 * | 3/2010 | Suzuki | H01L 25/0756 |
| | | | 257/E33.056 |
| 2010/0051995 A1 | 3/2010 | Katsuno et al. | |
| 2010/0078656 A1 | 4/2010 | Seo et al. | |
| 2010/0320488 A1 | 12/2010 | Horie | |
| 2011/0127549 A1 * | 6/2011 | Lee | H10H 20/856 |
| | | | 257/E33.074 |
| 2011/0204387 A1 * | 8/2011 | Kim | H01L 27/156 |
| | | | 257/E33.072 |
| 2011/0284910 A1 | 11/2011 | Iduka et al. | |
| 2012/0104439 A1 * | 5/2012 | Kim | H01L 33/08 |
| | | | 257/E33.061 |
| 2013/0026518 A1 * | 1/2013 | Suh | H01L 33/507 |
| | | | 257/E33.061 |
| 2013/0240931 A1 | 9/2013 | Akimoto et al. | |
| 2013/0306997 A1 * | 11/2013 | Lim | H01L 25/0753 |
| | | | 438/34 |
| 2013/0328088 A1 * | 12/2013 | Morikawa | H01L 33/54 |
| | | | 257/98 |
| 2014/0138722 A1 | 5/2014 | Yamada et al. | |
| 2014/0252390 A1 | 9/2014 | Yoon et al. | |
| 2014/0302625 A1 | 10/2014 | Sugizaki et al. | |
| 2015/0021638 A1 * | 1/2015 | Oh | H01L 27/156 |
| | | | 257/91 |
| 2015/0295138 A1 | 10/2015 | Chae et al. | |
| 2015/0362165 A1 | 12/2015 | Chu et al. | |
| 2016/0163941 A1 | 6/2016 | Seo et al. | |
| 2016/0225954 A1 * | 8/2016 | Kim | H01L 33/06 |
| 2016/0268478 A1 | 9/2016 | Tomizawa et al. | |
| 2016/0355412 A1 | 12/2016 | Collins et al. | |
| 2017/0040515 A1 | 2/2017 | Lee et al. | |
| 2017/0179097 A1 * | 6/2017 | Zhang | H01L 25/167 |
| 2017/0179192 A1 * | 6/2017 | Zhang | H01L 25/167 |
| 2017/0236866 A1 * | 8/2017 | Lee | H05B 47/19 |
| | | | 257/89 |
| 2017/0250219 A1 * | 8/2017 | Bower | H01L 33/46 |
| 2017/0256521 A1 * | 9/2017 | Cok | H01L 25/162 |
| 2017/0338210 A1 * | 11/2017 | Kim | H01L 27/153 |
| 2017/0352647 A1 * | 12/2017 | Raymond | H01L 25/0753 |
| 2018/0145217 A1 | 5/2018 | Chae et al. | |
| 2018/0166429 A1 * | 6/2018 | Chong | H01L 27/15 |
| 2018/0182931 A1 | 6/2018 | Lee et al. | |
| 2018/0204878 A1 | 7/2018 | Saito et al. | |
| 2018/0240952 A1 | 8/2018 | Moon et al. | |
| 2018/0315738 A1 * | 11/2018 | Bono | H01L 25/0753 |
| 2018/0358339 A1 * | 12/2018 | Iguchi | G09G 3/3233 |
| 2019/0088633 A1 * | 3/2019 | Tao | H01L 27/156 |
| 2019/0165207 A1 * | 5/2019 | Kim | H01L 33/385 |
| 2019/0355702 A1 * | 11/2019 | Herner | H01L 33/30 |
| 2019/0355786 A1 * | 11/2019 | Iguchi | H01L 23/552 |
| 2019/0355874 A1 * | 11/2019 | Herner | H01L 33/62 |
| 2019/0371777 A1 * | 12/2019 | Iguchi | H01L 24/29 |
| 2019/0385513 A1 * | 12/2019 | Iguchi | G09F 9/00 |
| 2019/0393198 A1 * | 12/2019 | Takeya | H01L 21/6838 |
| 2020/0052033 A1 * | 2/2020 | Iguchi | H01L 27/156 |
| 2020/0105824 A1 * | 4/2020 | Dimitropoulos | H01L 33/0075 |
| 2020/0105969 A1 | 4/2020 | Dimitropoulos et al. | |
| 2020/0111936 A1 * | 4/2020 | Lee | H01L 33/382 |
| 2020/0144233 A1 * | 5/2020 | Lee | H01L 33/32 |
| 2020/0144469 A1 * | 5/2020 | Yang | H10H 20/8312 |
| 2020/0176655 A1 * | 6/2020 | Iguchi | H01L 33/62 |
| 2020/0259055 A1 * | 8/2020 | Iguchi | G09F 9/30 |

FOREIGN PATENT DOCUMENTS

| | | |
|---|---|---|
| JP | 2008-262993 A | 10/2008 |
| JP | 2013-077679 A | 4/2013 |
| JP | 2013-197309 A | 9/2013 |
| JP | 2013-201340 A | 10/2013 |
| JP | 2016-171164 A | 9/2016 |
| JP | 2018-078279 A | 5/2018 |

OTHER PUBLICATIONS

Final Office Action on U.S. Appl. No. 16/723,857 Dtd Aug. 12, 2021.
Non-Final Office Action on U.S. Appl. No. 16/723,857 Dtd Nov. 22, 2021.
Notice of Allowance on U.S. Appl. No. 16/723,857 Dtd Mar. 10, 2022.

* cited by examiner

LIGHT-EMITTING DEVICE AND DISPLAY DEVICE

CROSS-REFERENCE TO RELATED PATENT APPLICATIONS

The present application is a continuation of U.S. patent application Ser. No. 16/723,857, filed on Dec. 20, 2019, which claims priority under 35 U. S. C. § 119 to Japanese Patent Application No. 2018-240457, filed Dec. 25, 2018, and Japanese Patent Application No. 2019-229616, filed Dec. 19, 2019, the contents of which are hereby incorporated by reference in their entirety.

BACKGROUND

The present disclosure relates to a light-emitting device and a display device.

Japanese Patent Publication No. 2008-262993 and Japanese Patent Publication No. 2018-78279 disclose display devices in which a large number of light-emitting devices that are smaller than conventional light-emitting devices are arranged. Such a display device is expected to exhibit superior characteristics such as high brightness, a high contrast ratio, a long product life, or flexibility.

However, with such display devices, intervals between light-emitting sections in which the light-emitting devices are arranged are extremely small, and crosstalk of light may occur between adjacent light-emitting sections. In Japanese Patent Publication No. 2008-262993 and Japanese Patent Publication No. 2018-78279, adjacent light-emitting sections have a shared transparent substrate or a shared transparent semiconductor layer and, due to the presence of light guided through this portion, crosstalk of light occurs between adjacent pixels. Such crosstalk of light that occurs between adjacent light-emitting sections causes a reduction in a contrast ratio, color mixing and the like, and hinders improvement in performance of the display device.

In consideration thereof, an object of the present invention is to provide a light-emitting device and a display device that are capable of suppressing the occurrence of crosstalk of light when a plurality of the light-emitting devices are arranged together.

SUMMARY

A light-emitting device according to one embodiment of the present invention includes: a semiconductor stacked body in which a first conductive semiconductor layer, an active layer, and a second conductive semiconductor layer are stacked in this order; a first insulating film that covers the active layer and the second conductive semiconductor layer; a first conductive layer that is arranged so as to continuously surround a lateral surface of the first conductive semiconductor layer being exposed from the first insulating film and that is connected to the lateral surface of the first conductive semiconductor layer; a second insulating film that covers the first conductive layer, the active layer, and the second conductive semiconductor layer and that has a hole disposed above the second conductive semiconductor layer for exposing the second conductive semiconductor layer; and a second conductive layer that continuously covers, via the second insulating film, an end portion of the first conductive layer located in proximity to an end portion of the second conductive semiconductor layer and that is connected to an upper surface of the second conductive semiconductor layer through the hole.

According to certain embodiments of the invention, a light-exiting region of a light-emitting device can be reduced, an abrupt brightness change between the light-exiting region and a non-light-emitting region around the light-exiting region can be realized, and an extraction efficiency of light can be improved. In addition, crosstalk of light can be suppressed in a display device in which a plurality of the light-emitting devices are arranged together.

DETAILED DESCRIPTION

Figure 1A:
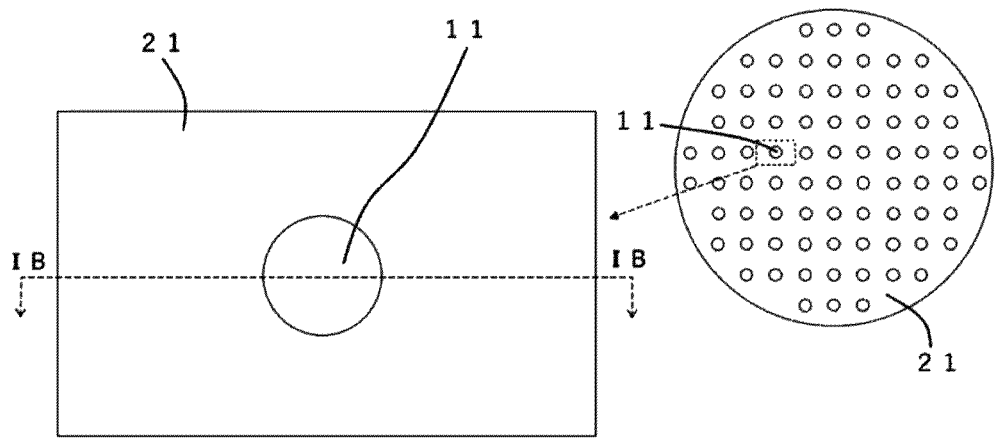
FIG. 1A is a schematic plan view of a first principal surface side of a substrate on which a mask pattern of a light-emitting device according to a first embodiment is formed.

The embodiments described below are merely examples for giving concrete shapes to the technical concepts of the present invention. The present invention is not limited to the embodiments described below. The present invention may include combinations of the embodiments described below. In addition, it should be noted that sizes, positional relationships, and the like of members shown in the respective drawings may sometimes be exaggerated or simplified in order to facilitate understanding. Furthermore, in principle, the same names or same reference characters denote similar or identical members, and repeated descriptions thereof will be omitted as appropriate.

First Embodiment

Figure 1B:
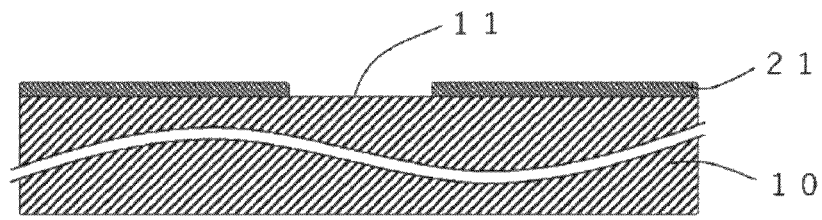
FIG. 1B is a schematic sectional view taken along line IB-IB in FIG. 1A.

A substrate 10 on which a semiconductor layer can be grown is used. For example, a substrate 10 made of a Si single crystal is used as a growth substrate. The substrate 10 made of Si has a (111) plane that is a first principal surface 11 and a (-1-1-1) plane that is a second principal surface 12 opposite to the first principal surface 11. A mask pattern 21 for selective epitaxial growth of a semiconductor layer is formed on the first principal surface 11 using a semiconductor wafer process technique such as chemical vapor deposition (CVD), photolithography, and reactive ion etching (RIE). The first principal surface 11 is exposed in an opening of the mask pattern 21. As shown in FIGS. 1A and 1B, the mask pattern 21 has a plurality of openings of which a diameter in a top view is in a range of, for example, approximately 1 to 50 μm, preferably approximately 1 to 10 μm, and more preferably approximately 1 to 3 μm. The plurality of openings are arranged, for example, in a square grid at a pitch in a range of approximately 5 to 100 μm, preferably approximately 5 to 50 μm, and more preferably approximately 5 to 10 μm.

Figure 2A:
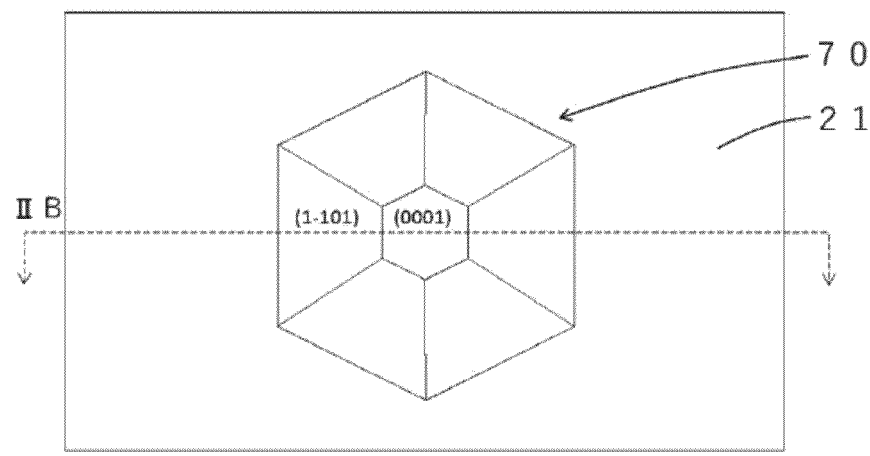
FIG. 2A is a schematic plan view of an island shaped semiconductor stacked body of the light-emitting device according to the first embodiment.
Figure 2B:
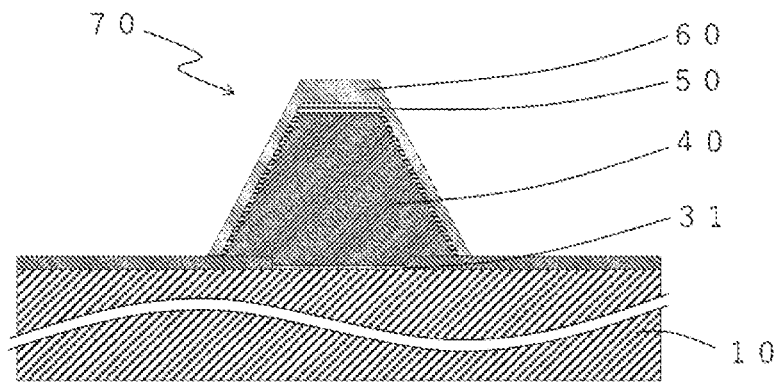
FIG. 2B is a schematic sectional view taken along line IIB-IIB in FIG. 2A.

An AlN buffer layer 31 is formed by a metal organic chemical vapor deposition (MOCVD) method on the first principal surface 11 that is exposed from the opening of the mask pattern 21. Subsequently, crystal growth of a first conductive semiconductor layer 40 including an n-type GaN layer or the like, an active layer 50 including a multiple quantum well layer, and a second conductive semiconductor layer 60 including a p-type GaN layer or the like are sequentially performed on the AlN buffer layer 31. Due to such crystal growth, a plurality of island shaped semiconductor stacked bodies 70, each having the first conductive semiconductor layer 40, the active layer 50, and the second conductive semiconductor layer 60, are formed. The first conductive semiconductor layer 40, the active layer 50, and the second conductive semiconductor layer 60 have a composition expressed by, for example, $Al_xIn_yGa_{1-x-y}N$ ($0 \le x \le 1$, $0 \le y \le 1$, $x+y \le 1$). A shape of each semiconductor stacked body 70 in a top view can be, for example, rectangular or hexagonal. In addition, as a size of each semiconductor stacked body 70 in a top view, for example, in the case of a rectangular shape or a hexagonal shape, one side can be 100 μm or less and preferably 50 μm or less. A semiconductor stacked body 70 is formed in a location corresponding to each of the plurality of openings of the mask pattern 21. Each semiconductor stacked body 70 is expressed using Miller indices of a hexagonal system as a hexagonal prismoid shape of which a top surface is a (0001) plane and a lateral surface is a {1-101} plane (FIGS. 2A and 2B). Alternatively, the semiconductor stacked body 70 may have a hexagonal pyramid shape, a shape combining a hexagonal prism and a hexagonal prismoid, or a shape combining a hexagonal prism and a hexagonal pyramid. When the semiconductor stacked body 70 is a tetragonal crystal system, a (111) A plane and a {1-10} plane respectively replace the (0001) plane and the {1-101} plane. The following description will focus on structures of one semiconductor stacked body 70 of the plurality of semiconductor stacked bodies 70 and a peripheral region of the one semiconductor stacked body 70.

The active layer 50 includes a first well layer 51, which is a multiple quantum well layer epitaxially grown on the (0001) plane of the first conductive semiconductor layer 40, and a second well layer 52, which is a multiple quantum well layer epitaxially grown on the {1-101} planes of the first conductive semiconductor layer 40. As shown in FIG. 2B, the first well layer 51 is disposed on an upper surface of the first conductive semiconductor layer 40 and the second well layer 52 is disposed on a lateral surface of the first conductive semiconductor layer 40. The first well layer 51 and the second well layer 52 are continuously formed on the upper surface and the lateral surface of the first conductive semiconductor layer 40, and the second well layer 52 is connected at an outer edge of the first well layer 51. A film thickness of the first well layer 51 is thicker than a film thickness of the second well layer 52. Because an energy difference between sub-bands is smaller in a thick quantum well layer than in a thin quantum well layer, light is emitted due to pair annihilation between electrons and holes in the first well layer 51. Because the outer edge of the first well layer 51 is covered by epitaxially grown crystals, a surface state does not exist on the outer edge of the first well layer 51 and a non-light-emitting transition related to a surface state does not occur on the outer edge of the first well layer 51. Therefore, the second well layer 52 is preferably connected to the outer edge of the first well layer 51.

Figure 3A:
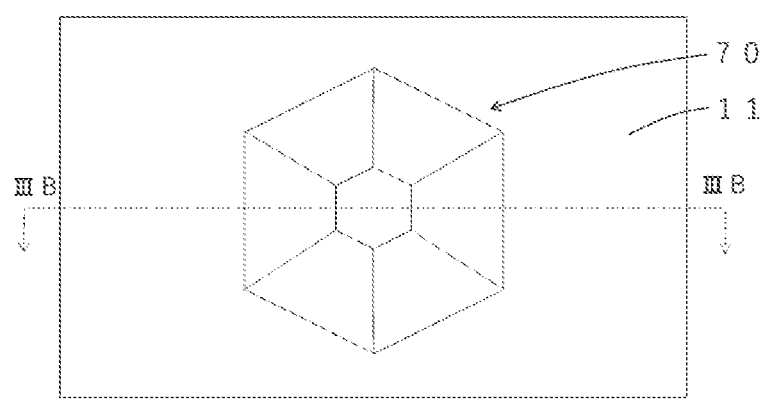
FIG. 3A is a schematic plan view after removing a mask pattern covering the island shaped semiconductor stacked body of the light-emitting device according to the first embodiment.
Figure 3B:
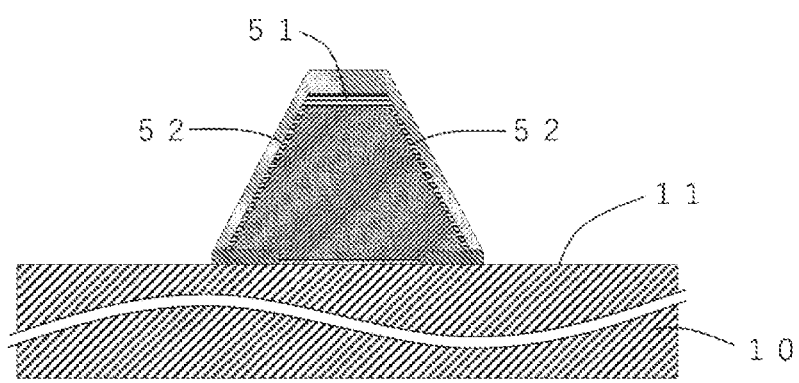
FIG. 3B is a schematic sectional view taken along line IIIB-IIIB in FIG. 3A.
Figure 4A:
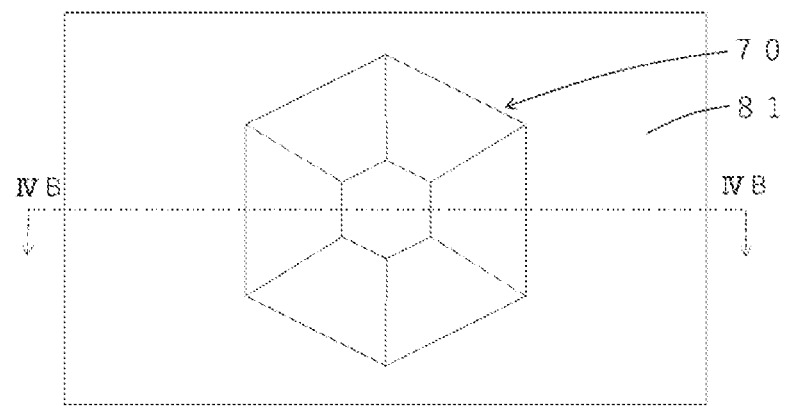
FIG. 4A is a schematic sectional view after forming a mask layer covering the semiconductor stacked body of the light-emitting device according to the first embodiment.
Figure 4B:
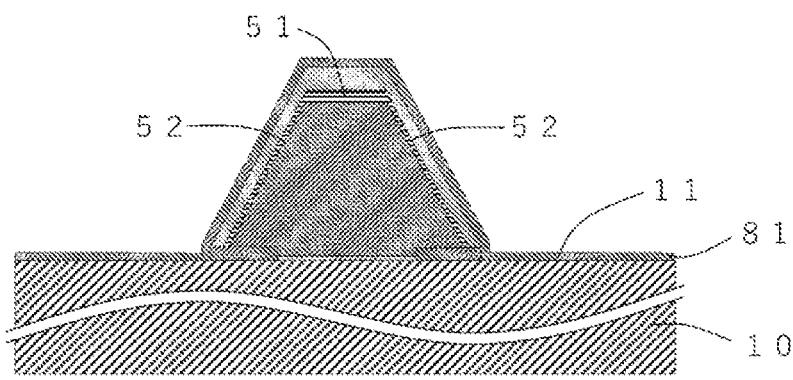
FIG. 4B is a schematic sectional view taken along line IVB-IVB in FIG. 4A.

As shown in FIG. 3, among the mask pattern 21, the mask pattern 21 not disposed in a location overlapping with the semiconductor stacked body 70 in a top view is removed by wet etching. At this point, when there are unnecessary crystals formed on the mask pattern 21 during crystal growth, the crystals are removed together with the mask pattern 21. In addition, as shown in FIGS. 4A and 4B, a RIE mask layer 81 that continuously covers the semiconductor stacked body 70 and the first principal surface 11 is formed.

Figure 5A:
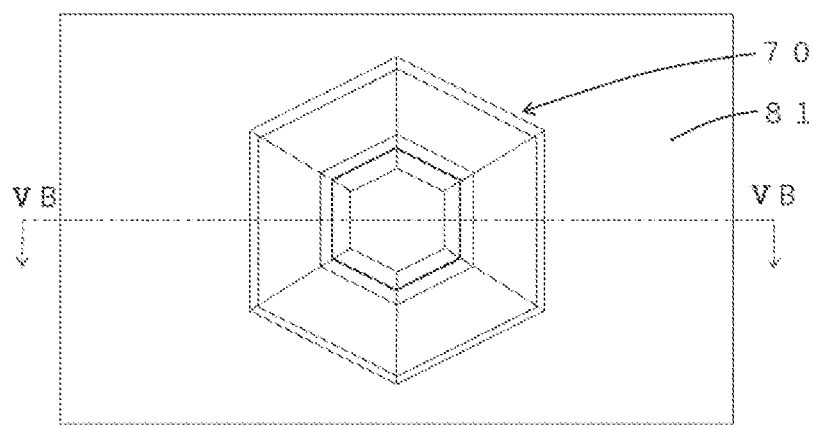
FIG. 5A is a schematic sectional view after exposing a first connecting region of the island shaped semiconductor stacked body of the light-emitting device according to the first embodiment.
Figure 5B:
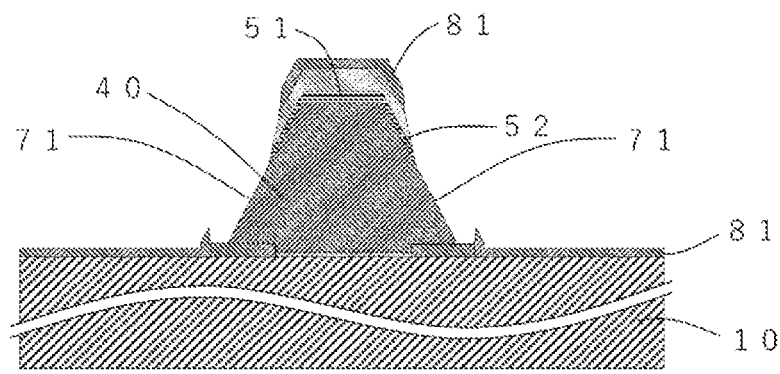
FIG. 5B is a schematic sectional view taken along line VB-VB in FIG. 5A.

A part of the second conductive semiconductor layer 60 and a part of the second well layer 52 are removed while removing the mask layer 81 disposed in a lower region of the lateral surface of the semiconductor stacked body 70 by RIE. Accordingly, as shown in FIGS. 5A and 5B, a part of the lateral surface of the first conductive semiconductor layer 40 is exposed from the second conductive semiconductor layer 60 and the second well layer 52. The first conductive semiconductor layer 40 exposed from the second conductive semiconductor layer 60 and the second well layer 52 constitutes a first connecting region 71 of the semiconductor stacked body 70 to be connected to a first conductive layer 110 to be described later. Subsequently, the entire mask layer 81 is removed.

Figure 6A:
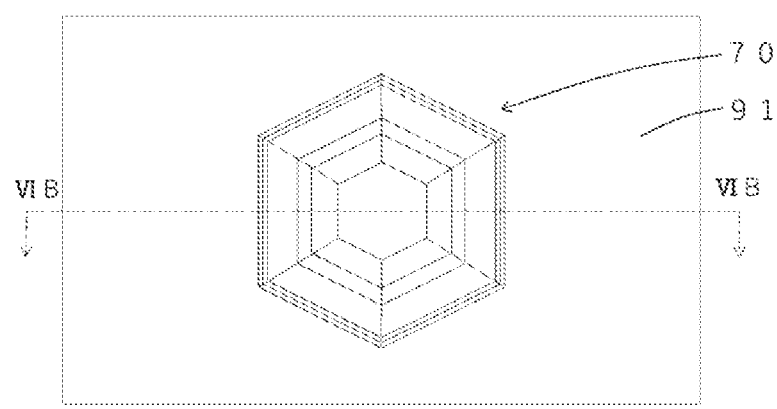
FIG. 6A is a schematic plan view when re-exposing the first connecting region of the semiconductor stacked body after forming a first insulating film of the light-emitting device according to the first embodiment.
Figure 6B:
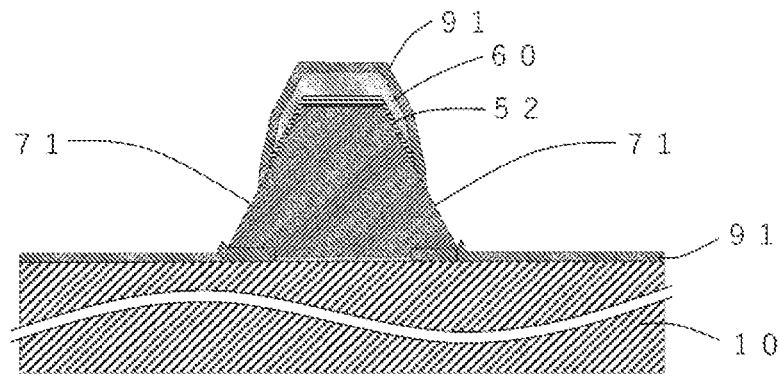
FIG. 6B is a schematic sectional view taken along line VIB-VIB in FIG. 6A.

A first insulating film 91 that continuously covers the semiconductor stacked body 70 and the first principal surface 11 is formed. For example, silicon nitride or silicon oxide can be used as the first insulating film 91. Subsequently, the first insulating film 91 positioned on the first connecting region 71 of the semiconductor stacked body 70 is selectively removed by RIE and, as shown in FIGS. 6A and 6B, the first connecting region 71 is once again exposed from the second conductive semiconductor layer 60 and the second well layer 52. The first connecting region 71 continuously surrounds the lower region of the lateral surface of the island shaped semiconductor stacked body 70 (FIG. 6A). The first insulating film 91 is disposed in order to prevent a short circuit between the second conductive semiconductor layer 60 and the second well layer 52 and covers at least surfaces of the second conductive semiconductor layer 60 and the second well layer 52.

Figure 7A:
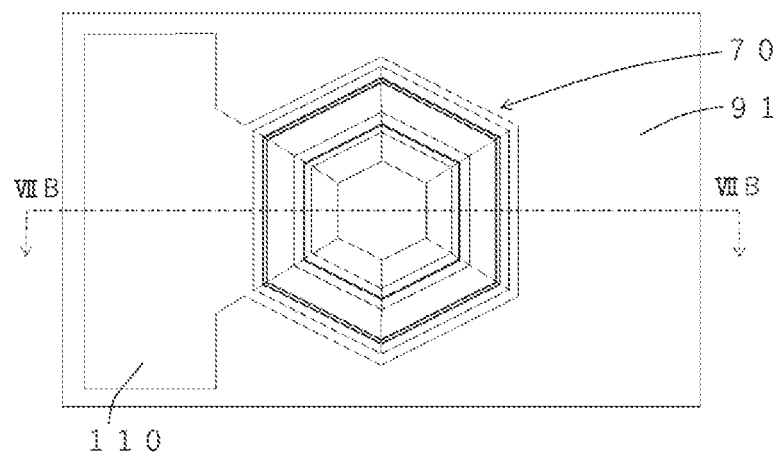
FIG. 7A is a schematic plan view after forming a first conductive layer of the light-emitting device according to the first embodiment.
Figure 7B:
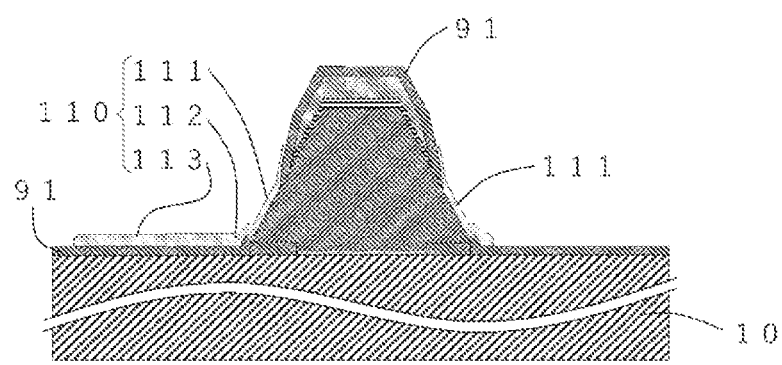
FIG. 7B is a schematic sectional view taken along line VIIB-VIIB in FIG. 7A.
Figure 7C:
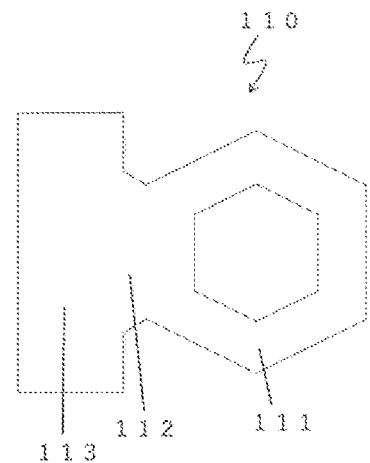
FIG. 7C is a top orthographic view of the first conductive layer of the light-emitting device according to the first embodiment.

The first conductive layer 110 is disposed in the lower region of the lateral surface of the semiconductor stacked body 70. The first conductive layer 110 is formed on the first connecting region 71 of the semiconductor stacked body 70 and on a region of a part of the first insulating film 91. A known semiconductor wafer process technique can be used to form the first conductive layer 110. As shown in FIGS. 7A to 7C, in a top view of the semiconductor stacked body 70, the first conductive layer 110 is formed so as to extend onto the first insulating film 91 positioned on an outer side of the semiconductor stacked body 70 and is disposed so as to continuously surround the lower region of the lateral surface of the semiconductor stacked body 70. The first conductive layer 110 is electrically connected to the first conductive semiconductor layer 40 in the first connecting region 71. The first conductive layer 110 has a first semiconductor connecting section 111, a first extended section 112, and a first pad section 113. The first semiconductor connecting section 111 is a portion to be connected to the first conductive semiconductor layer 40 in the first connecting region 71. The first pad section 113 is a portion where a first metallic section 131 (to be described later) is to be disposed and is positioned on an outer side of a region where the semiconductor stacked body 70 is arranged in a top view. The first extended section 112 is a portion that connects the first semiconductor connecting section 111 and the first pad section 113 to each other.

The first conductive layer 110 is configured to reflect light emitted from the semiconductor stacked body 70 while securing conduction with the semiconductor stacked body 70. In order to produce such an effect, a metal material having high light reflectivity and conductivity is preferably used as the first conductive layer 110. For example, a multilayer film including silver, aluminum, or rhodium or an alloy layer containing these metal materials is preferably used as the first conductive layer 110. A film thickness of the first conductive layer 110 is preferably equal to or greater than a film thickness that prevents transmission of light emitted from the semiconductor stacked body 70. For example, a thickness of the first conductive layer 110 can be 100 nm or more and preferably in a range of 100 to 500 nm. When a plurality of semiconductor stacked bodies 70 are disposed, the first conductive layer 110 may be disposed so as to extend up to an adjacent another semiconductor stacked body 70. For example, two semiconductor stacked bodies 70 may be connected in series by the first conductive layer 110. A description similar to that of the first conductive layer 110 applies to a second conductive layer 120 to be described later.

A second insulating film 92 is formed that covers the first conductive layer 110 as well as the first insulating film 91 covering the active layer 50 and the second conductive semiconductor layer 60. Subsequently, parts of the first insulating film 91 and the second insulating film 92 positioned above the second conductive semiconductor layer 60 are removed to form a hole that penetrates the first insulating film 91 and the second insulating film 92. A part of the second conductive semiconductor layer 60 is exposed from the hole. The second insulating film 92 is disposed in order to prevent a short circuit between the first conductive layer 110 and the second conductive layer 120. A material similar to that of the first insulating film 91 described above can be used as the second insulating film 92. The second insulating film 92 may be configured as a dielectric multilayer film in which two types of dielectric layers with different refractive indices are stacked in plurality. For example, a dielectric multilayer film in which a silicon oxide layer and a titanium oxide layer are alternately stacked and that is designed to reflect light from the semiconductor stacked body 70 can be used.

Figure 8A:
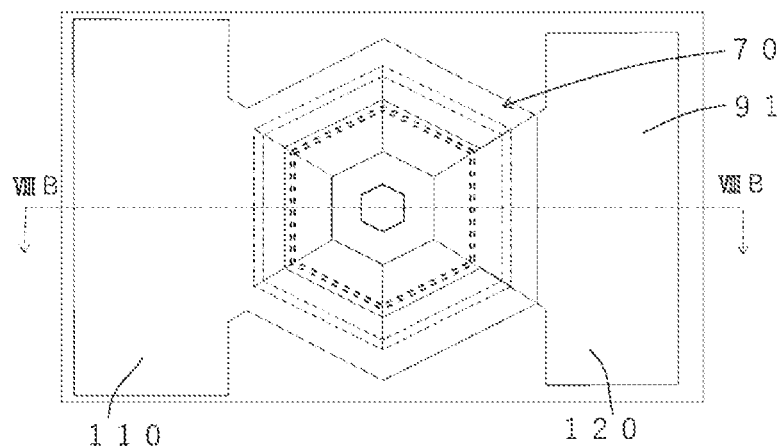
FIG. 8A is a schematic plan view after forming a second conductive layer of the light-emitting device according to the first embodiment.
Figure 8B:
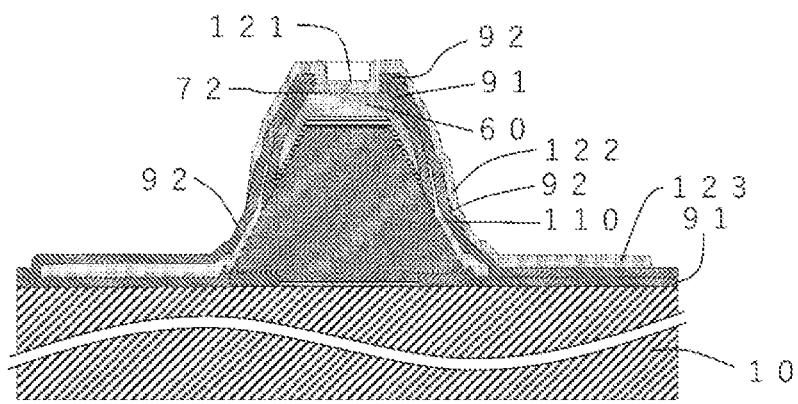
FIG. 8B is a schematic sectional view taken along line VIIIB-VIIIB in FIG. 8A.
Figure 8C:
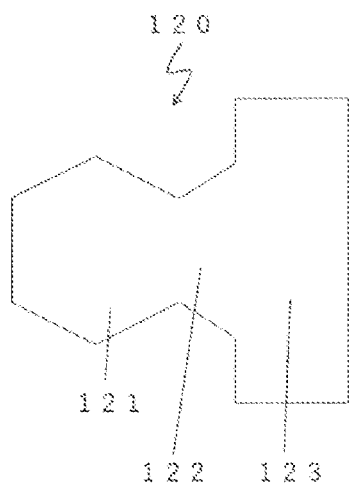
FIG. 8C is a top orthographic view of the second conductive layer of the light-emitting device according to the first embodiment.

As shown in FIGS. 8A to 8C, the second conductive layer 120 is continuously formed on the second conductive semiconductor layer 60 exposed from the hole formed in the second insulating film 92 and on a region of a part of the second insulating film 92 positioned on an outer side of the semiconductor stacked body 70 in a top view. A region where the second conductive semiconductor layer 60 and the second conductive layer 120 are electrically connected constitutes a second connecting region 72 of the semiconductor stacked body 70. The second conductive layer 120 is formed so as to continuously cover an end portion of the first conductive layer 110 located in proximity to an end portion of the second conductive semiconductor layer 60 via the second insulating film 92. In addition, the second conductive layer 120 is formed so as to extend to an outer side of the semiconductor stacked body 70 in a top view and to cover the second insulating film 92 and the first insulating film 91 disposed on the first principal surface 11. The second conductive layer 120 has a second semiconductor connecting section 121, a second extended section 122, and a second pad section 123. The second semiconductor connecting section 121 is a portion to be connected to the second conductive semiconductor layer 60 in the second connecting region 72. The second pad section 123 is a portion where a second metallic section 132 (to be described later) is to be disposed and is positioned on an outer side of a region where the semiconductor stacked body 70 is arranged in a top view. The second extended section 122 is a portion that connects the second semiconductor connecting section 121 and the second pad section 123 to each other.

Forming the second conductive layer 120 on the second insulating film 92 that covers the first conductive layer 110 enables positioning of patterns of the first conductive layer 110 and the second conductive layer 120 to be performed more readily than in a case in which patterns of the first conductive layer 110 and the second conductive layer 120 are formed on a single insulating film. Due to the upper surface and the lateral surface of the semiconductor stacked body 70 being covered by the first conductive layer 110 and the second conductive layer 120, which have light reflectivity, light emitted from the semiconductor stacked body 70 is reflected by the upper surface and the lateral surface of the semiconductor stacked body 70. As a result, light can be directed toward the lower surface of the semiconductor stacked body 70 that is a primary light-extracting surface and light extraction efficiency can be improved. In addition, leakage light from the lateral surface of the semiconductor stacked body 70 can be suppressed. The upper surface and the lateral surface of the semiconductor stacked body 70 are preferably covered in a gapless manner by the first conductive layer 110 and the second conductive layer 120 that have light reflectivity. The lateral surface of the semiconductor stacked body 70 is preferably inclined in relation to the first principal surface 11. Accordingly, because light emitted from the active layer 50 is incident on the inclined lateral surface of the semiconductor stacked body 70 and reflected by the first conductive layer 110 and the second conductive layer 120, the light can be directed toward the lower surface of the first conductive semiconductor layer 40. Therefore, light extraction efficiency of the light-emitting device can be improved. The second conductive layer 120 may be disposed so as to extend up to an adjacent another semiconductor stacked body 70. For example, two semiconductor stacked bodies 70 may be connected in series by the second conductive layer 120.

Figure 9A:
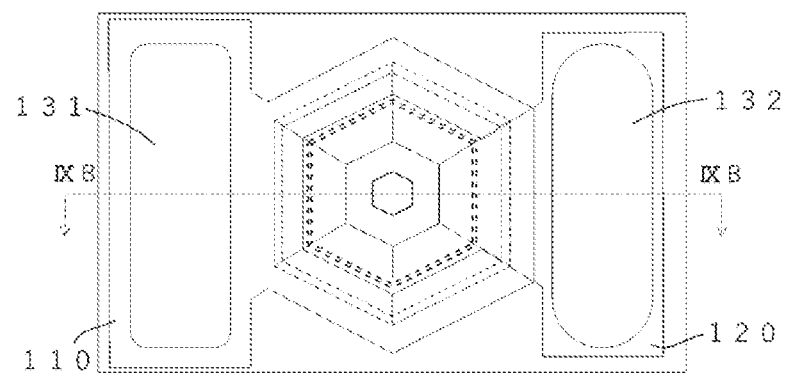
FIG. 9A is a schematic plan view after forming a first metallic section and a second metallic section of the light-emitting device according to the first embodiment.
Figure 9B:
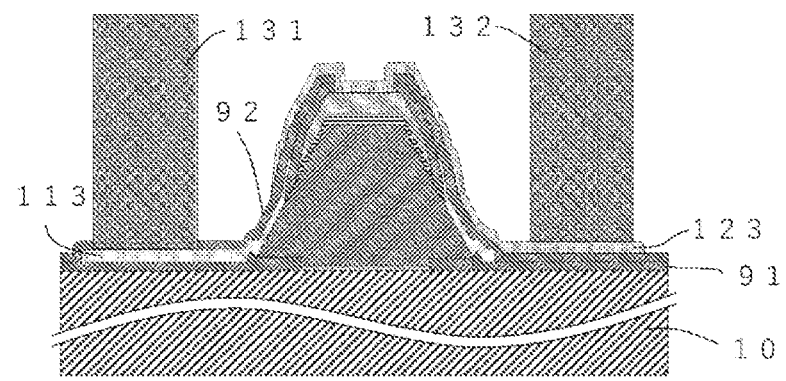
FIG. 9B is a schematic sectional view taken along line IXB-IXB in FIG. 9A.

An opening is formed in the second insulating film 92 positioned on the first pad section 113 to expose the first pad section 113. As shown in FIGS. 9A and 9B, the first metallic section 131 is formed on the exposed first pad section 113, and the second metallic section 132 is formed on the second pad section 123, respectively. The first metallic section 131 and the second metallic section 132 become conductive paths that, for example, when the light-emitting device is mounted to wiring disposed on a mounting substrate, supply power to the semiconductor stacked body 70 via the wiring. The plurality of light emitting devices can be arranged in an array of n rows and m columns (n and m are integers of 1 or more) on the mounting substrate. As the first metallic section 131 and the second metallic section 132, a metal with high electric conductivity is preferably used and, for example, copper can be used. For example, the first metallic section 131 and the second metallic section 132 can be formed by partial plating using a masking method.

By forming the first metallic section 131 and the second metallic section 132 to be conductive paths on the outer side of the semiconductor stacked body 70 in a top view, because connection areas of the first metallic section 131 and the second metallic section 132 with the wiring can be determined without being dependent on an area of the semiconductor stacked body 70 in a top view, the connection area with the wiring can be readily secured. In addition, because heat and mechanical stress created when connecting the first metallic section 131 and the second metallic section 132 to the wiring are not directly applied to the semiconductor stacked body 70, load on the semiconductor stacked body 70 can be reduced. The first metallic section 131 and the second metallic section 132 can be given different shapes in order to make it easier to distinguish between a cathode and an anode.

Figure 10:
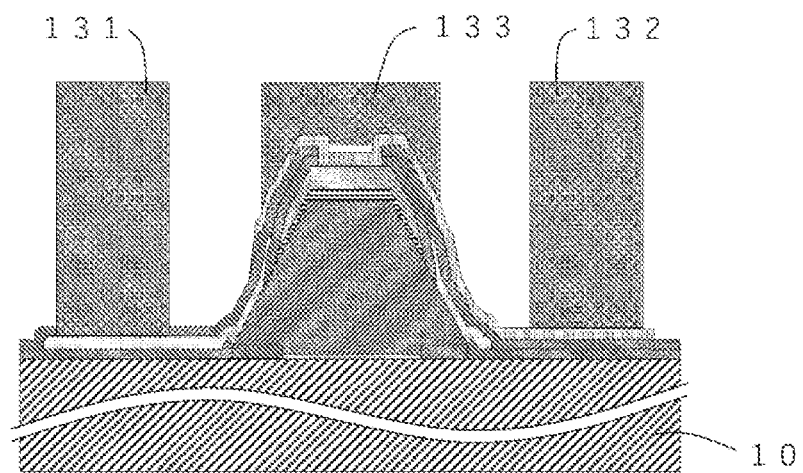
FIG. 10 is a schematic sectional view showing a modification of the formation of a metallic section of the light-emitting device according to the first embodiment.

As another configuration, as shown in FIG. 10, a third metallic section 133 may be formed above the semiconductor stacked body 70 concurrently with the formation of plating of the first metallic section 131 and the second metallic section 132 to be conductive paths. The third metallic section 133 above the semiconductor stacked body 70 can function as a heat radiation path that, by being thermally connected to a heat sink, releases heat generated by the semiconductor stacked body 70.

Figure 11A:
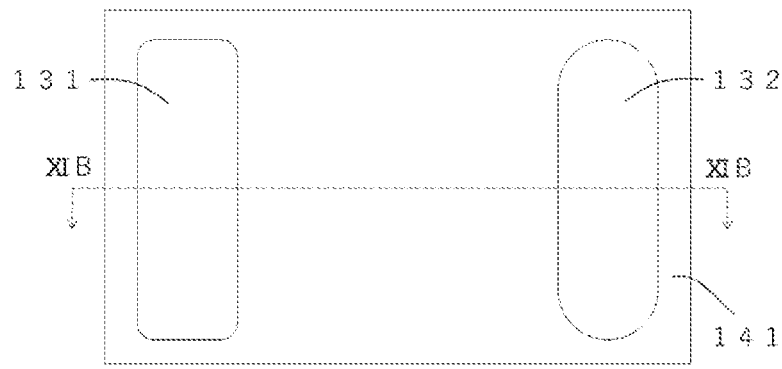
FIG. 11A is a schematic plan view after forming a resin layer according to the first embodiment.
Figure 11B:
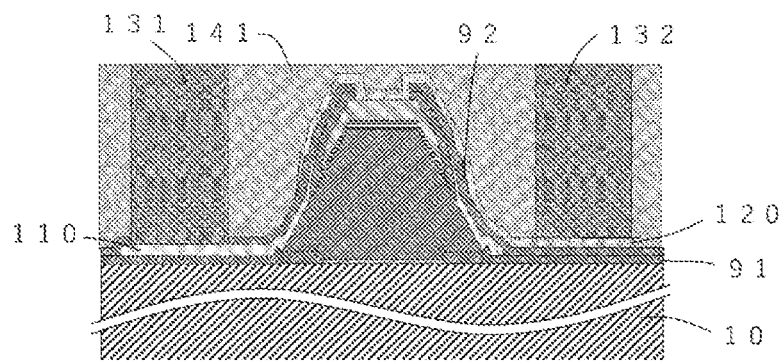
FIG. 11B is a schematic sectional view taken along line XIB-XIB in FIG. 11A.

As shown in FIGS. 11A and 11B, a light-shielding first resin layer 141 that covers the first metallic section 131, the second metallic section 132, the second conductive layer 120, and the second insulating film 92 is formed. Subsequently, the first resin layer 141 is planarized by grinding and polishing and the first metallic section 131 and the second metallic section 132 are exposed from the first resin layer 141. Lateral surfaces of the first metallic section 131 and the second metallic section 132 are covered by the first resin layer 141. The first resin layer 141 is disposed in order to reflect or shield light leaking from gaps between the second conductive layer 120 and the first conductive layer 110, and light transmitted through the second conductive layer 120 and the first conductive layer 110, and to suppress leakage light from the semiconductor stacked body 70. Upper surfaces of the first metallic section 131 and the second metallic section 132 exposed from the first resin layer 141 constitute a connecting surface with wiring (hereinafter, may be referred to as a "conductive surface"). In addition, a connecting member such as a solder layer or a connecting bump including an In/Au micro-bump may be disposed as appropriate, in accordance with a connecting method to the wiring, on the upper surfaces of the first metallic section 131 and the second metallic section 132, which constitute the connecting surface with the wiring.

A resin layer in which a light-reflecting substance is contained in an insulating resin can be used as the first resin layer 141. As the resin, for example, a silicone resin, an epoxy resin, or an acrylic resin can be used. As the light-reflecting substance, for example, titanium oxide, silicon oxide, or aluminum oxide can be used. The first resin layer 141 can be formed using, for example, a compression molding technique or a transfer molding technique.

Figure 12A:
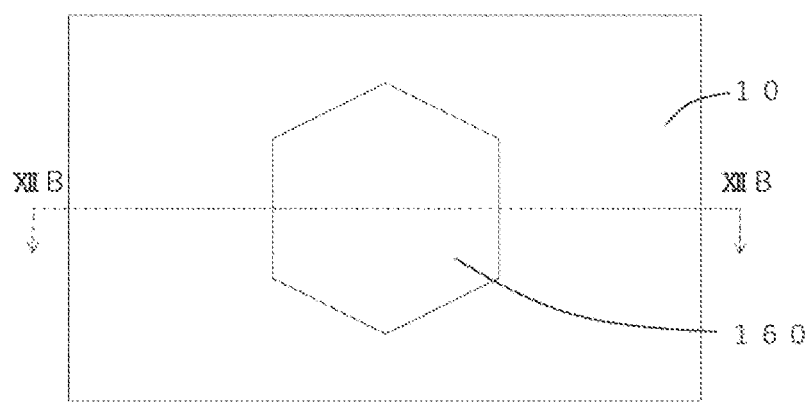
FIG. 12A is a schematic plan view after grinding and polishing a second principal surface of a substrate and forming an opening in the substrate of the light-emitting device according to the first embodiment.
Figure 12B:
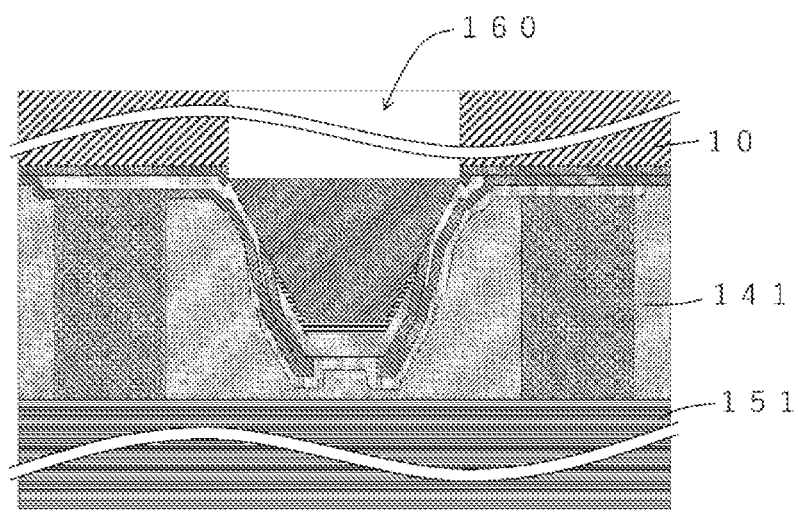
FIG. 12B is a schematic sectional view taken along line XIIB-XIIB in FIG. 12A.

As shown in FIGS. 12A and 12B, the first resin layer 141 side of a wafer in which the semiconductor stacked body 70 is disposed on the substrate 10 is attached to a first supporter 151. When using selective epitaxial growth to grow the semiconductor stacked body 70, warpage of the wafer is suppressed as compared to a case in which a semiconductor layer is epitaxially grown over the entire substrate 10. Therefore, the first supporter 151 and the wafer can be readily attached to each other.

The substrate 10 is ground and polished from a side of the second principal surface 12 of the substrate 10, which is a bottom surface of the wafer, and thinned down until a thickness of the substrate 10 is reduced to approximately 10 μm to 50 μm. After grinding and polishing, a low-reflectance metallic film made of, for example, metallic chromium and chromium oxide may be formed on the second principal surface 12. Forming such a metallic film is preferable in a display device because a reflectance in the second principal surface 12 of the substrate 10 can be reduced and the second principal surface 12 can be made black, thereby increasing a difference in contrast between when a light-emitting element is lighted and when the light-emitting element is turned off.

As shown in FIGS. 12A and 12B, among the substrate 10, the substrate 10 positioned in a region where the semiconductor stacked body 70 is disposed is removed and an opening 160 is formed in the substrate 10. The opening 160 of the substrate 10 is disposed in a location corresponding to the region where the semiconductor stacked body 70 is disposed. The first conductive semiconductor layer 40 is exposed in the opening 160. A semiconductor wafer process technique such as photolithography and inductively coupled plasma-ME (ICP-RIE) is used to remove the substrate 10. In addition, in order to expose the first conductive semiconductor layer 40, the mask pattern 21 and the AlN buffer layer 31 are removed. A planar view shape of the opening 160 of the substrate is, for example, a hexagonal shape. The opening 160 of the substrate 10 constitutes a light-exiting surface where light from the semiconductor stacked body 70 is mainly extracted. Instead of a hexagonal shape, the planar view of the opening 160 of the substrate can have other shapes such as a circle.

As shown in 13A and 13B, the opening 160 of the substrate 10 is filled with a wavelength-converting member 170. The wavelength-converting member 170 that has been filled the opening 160 of the substrate 10 and cured is a light transmissive resin containing a phosphor. The wavelength-converting member 170 includes a base material and a phosphor. The base material of the wavelength-converting member 170 is a resin that transmits light such as epoxy resin or silicone resin or an inorganic material that transmits light such as silica. Examples of the phosphor to be contained in the wavelength-converting member 170 include quantum dot phosphors, garnet-based phosphors (for example, YAG:Ce and LAG:Ce), oxide phosphors (for example, $YPVO_4$:Eu, $Zn_2SiO_4$:Mn, and $BaMg_2Al_{14}O_{24}$:Eu), oxynitride phosphors (for example, $Si_{6-z}Al_zO_zN_{8-z}$:Eu (0<Z<4.2)), nitride-based phosphors (for example, CASN and SCASN), fluoride phosphors (for example, $K_2SiF_6$:Mn), and sulfide-based phosphors.

In the base material of the wavelength-converting member 170 that fills the inside of the opening 160 of the substrate 10, the phosphor can be unevenly distributed toward the semiconductor stacked body 70 using a method such as centrifugal settling. After arranging the wavelength-converting member 170 in the opening 160 of the substrate 10, a transparent resin may be arranged on top of the wavelength-converting member 170. Furthermore, a light-reflecting member may be disposed on a lateral surface of the opening 160 of the substrate 10. Providing such a member, a region with a low phosphor density among the wavelength-converting member 170 or a region where the transparent resin is arranged inside the opening 160 of the substrate 10 has a function of a so-called light pipe. When making the opening 160 of the substrate 10 a uniform light source, a planar view shape of the opening 160 of the substrate 10 is preferably a hexagonal shape, a square shape, or a triangular shape.

Figure 14A:
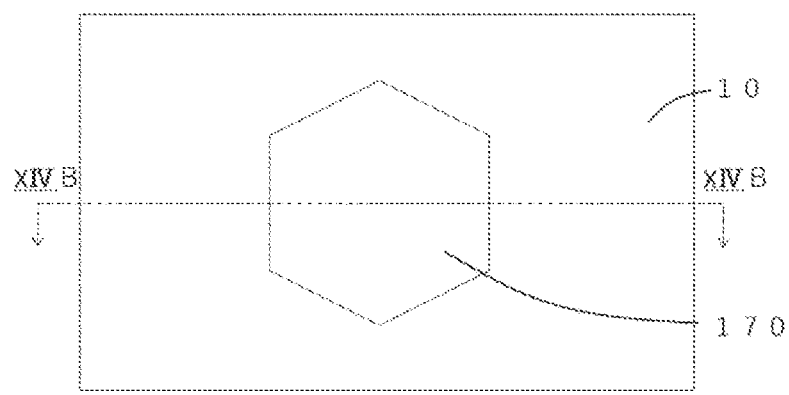
FIG. 14A is a schematic plan view after singulation of the light-emitting device according to the first embodiment.
Figure 14B:
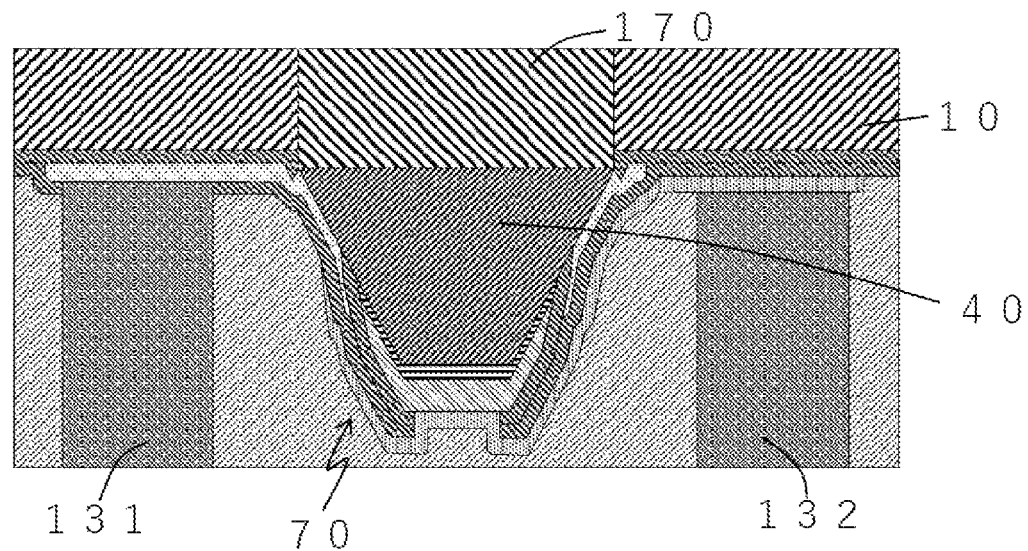
FIG. 14B is a schematic sectional view taken along line XIVB-XIVB in FIG. 14A.

The substrate 10 and the first resin layer 141 are cut and the first supporter 151 is removed to obtain a singulated light-emitting device shown in FIGS. 14A and 14B.

According to the present embodiment, a light-emitting device can be manufactured in which the upper surface and the lateral surface of the island shaped semiconductor stacked body 70 including the active layer 50 that emits light are covered by the first conductive layer 110 connected to the first conductive semiconductor layer 40, the second conductive layer 120 connected to the second conductive semiconductor layer 60, and the first resin layer 141. In addition, the first conductive layer 110 is arranged so as to continuously surround the lateral surface of the first conductive semiconductor layer 40, and an end portion of the first conductive layer 110 located in proximity to an end potion of the second conductive semiconductor layer 60 is continuously covered by the second conductive layer 120. Because the light-emitting device configured in this manner is capable of reflecting light directed toward the upper surface and the lateral surface of the semiconductor stacked body 70 among light from the semiconductor stacked body 70, light extraction efficiency can be improved while suppressing leakage light from the upper surface and the lateral surface of the semiconductor stacked body 70. Therefore, in a display device in which the light-emitting device according to the present embodiment is arranged in plurality on the substrate 10, an occurrence of crosstalk between light-emitting sections in which the light-emitting devices are arranged can be suppressed. Because spread of emitted light can be suppressed by surrounding the wavelength-converting member 170 arranged on a light-exiting side of the light-emitting device by the substrate 10 made of Si having a light-shielding property, a light source with a small etendue can be realized.

Second Embodiment

In the second embodiment, a light-shielding second resin layer 142 is used in place of the substrate 10 that is made of Si and that surrounds the wavelength-converting member 170 arranged on the light-exiting side of the light-emitting device in the first embodiment.

Specifically, after grinding and polishing the second principal surface 12 of the substrate 10, the substrate 10 is retained in a columnar shape in a location corresponding to a region where the island shaped semiconductor stacked body 70 is disposed by removing the substrate 10 positioned in other regions. With the exception of the first insulating film 91 between the island shaped semiconductor stacked body 70 and the substrate 10 retained in a columnar shape, the first insulating film 91 in other regions is removed.

The second resin layer 142 that entirely covers the substrate 10 retained in a columnar shape, the first conductive layer 110, the second conductive layer 120, and the first resin layer 141 is formed. As a resin used for the second resin layer 142, for example, an epoxy resin colored by adding a black pigment such as carbon black can be used.

Subsequently, by grinding and polishing the second resin layer 142, a part of the columnar substrate 10 is exposed from the second resin layer 142.

The substrate 10 exposed by grinding and polishing the second resin layer is removed by etching to form an opening in the second resin layer 142. The opening of the second resin layer 142 corresponds to the region where the semiconductor stacked body 70 is disposed in a top view. Subsequently, the wavelength-converting member 170 is disposed inside the opening of the second resin layer 142. The light-shielding second resin layer 142 is disposed in a region where a conductive surface on which the first pad section 113 and the first metallic section 131 are electrically connected to each other and a conductive surface on which the second pad section 123 and the second metallic section 132 are electrically connected to each other are positioned. Because reflectance on the surface of the second resin layer 142 is low and the surface of the second resin layer 142 is made black, a difference in contrast between when a light-emitting element is lighted and when the light-emitting element is turned off can be increased, which is preferable for a display device.

Singulation is performed by cutting the second resin layer 142 and the first resin layer 141 and removing the first supporter 151.

Third Embodiment

In the third embodiment, in place of the substrate 10 made of Si as a growth substrate according to the first embodiment, a substrate 10 made of sapphire and an $Al_uIn_vGa_{1-u-v}N$ layer (0≤u≤1, 0≤v≤1, u+v≤1) is used as a wafer. For example, a GaN low-temperature buffer layer and an $Al_uIn_vGa_{1-u-v}N$ layer are sequentially stacked on a c plane of the substrate 10 made of sapphire.

The wafer in which an $Al_uIn_vGa_{1-u-v}N$ layer is stacked on the c plane of a sapphire substrate may be a wafer in which the $Al_uIn_vGa_{1-u-v}N$ layer is formed on the entire c plane of the sapphire substrate, a wafer in which, after forming the $Al_uIn_vGa_{1-u-v}N$ layer on the entire c plane of the sapphire substrate, a plurality of island shaped $Al_uIn_vGa_{1-u-v}N$ layers are arranged on the c plane of the sapphire substrate by photolithography and an etching technique such as RIE, or a wafer in which a plurality of island shaped $Al_uIn_vGa_{1-u-v}N$ layers are arranged and formed on the c plane of the sapphire substrate by selective epitaxial growth.

Because processes after selective epitaxial growth of the semiconductor stacked body 70 on the substrate 10 up to attaching the wafer to the first supporter 151 are basically similar to the processes in the first embodiment, descriptions thereof will be omitted as appropriate. Subsequently, the substrate 10 is removed using, for example, laser lift-off, and the buffer layer and the like are removed by RIE. The light-shielding second resin layer 142 is formed on a surface from which the substrate 10 has been removed, and an opening from which the first conductive semiconductor layer 40 is to be exposed is formed in a location corresponding to a region where the semiconductor stacked body 70 is disposed.

After filling the opening of the second resin layer 142 with the wavelength-converting member 170, singulation is performed by cutting the second resin layer 142 and the first resin layer 141 along scheduled singulation lines, and removing the first supporter 151.

Fourth Embodiment

Figure 13A:
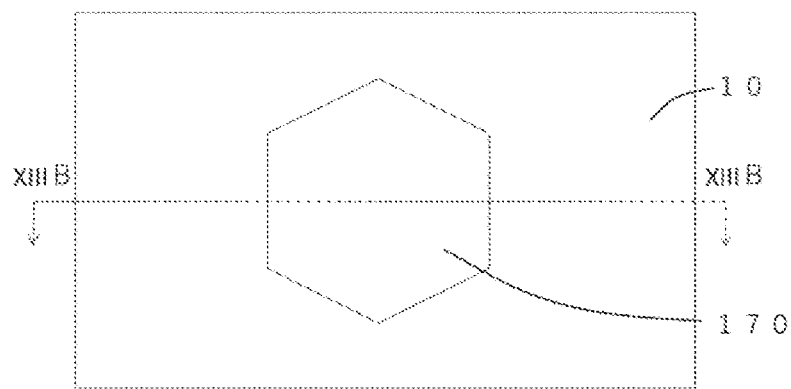
FIG. 13A is a schematic plan view after filling of a phosphor-containing transmissive resin in the light-emitting device according to the first embodiment.
Figure 13B:
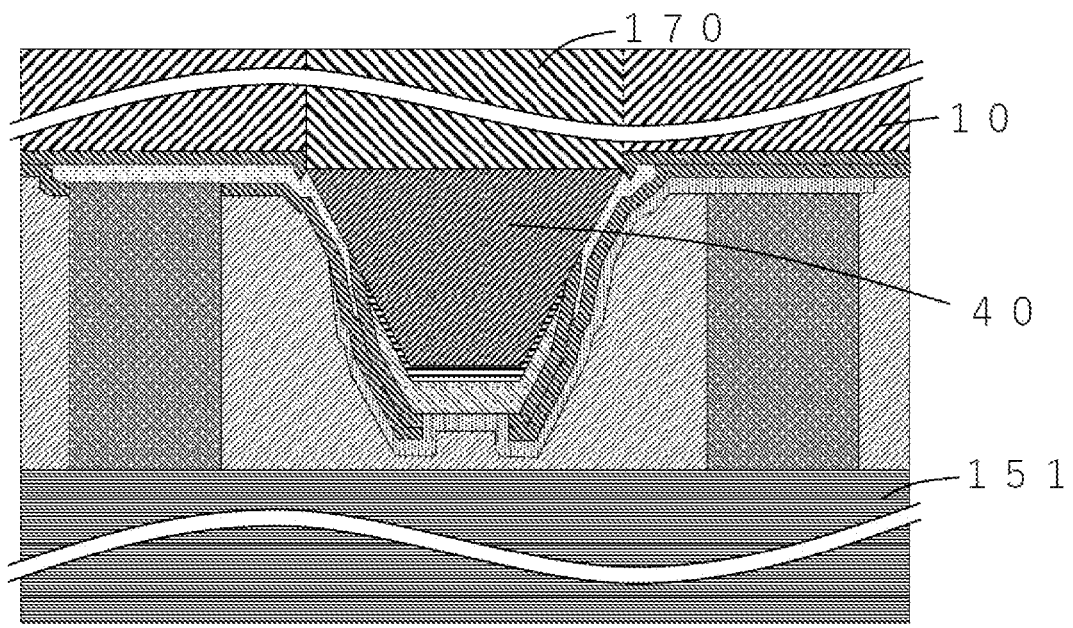
FIG. 13B is a schematic sectional view taken along line XIIIB-XIIIB in FIG. 13A.

A structure, as shown in FIG. 13B, in which a plurality of light-emitting devices are attached to the first supporter 151 is prepared by processes similar to those of the first embodiment. Subsequently, a supporting member is attached toward the wavelength-converting member 170, and the first supporter 151 is removed.

For example, a TFT-attached wiring substrate 250 (a mounting substrate) is prepared in which a plurality of TFT elements 252 and conductive pads respectively corresponding to each of the first metallic sections 131 and each of the second metallic sections 132 are arranged in a matrix pattern on a glass substrate.

Figure 15A:
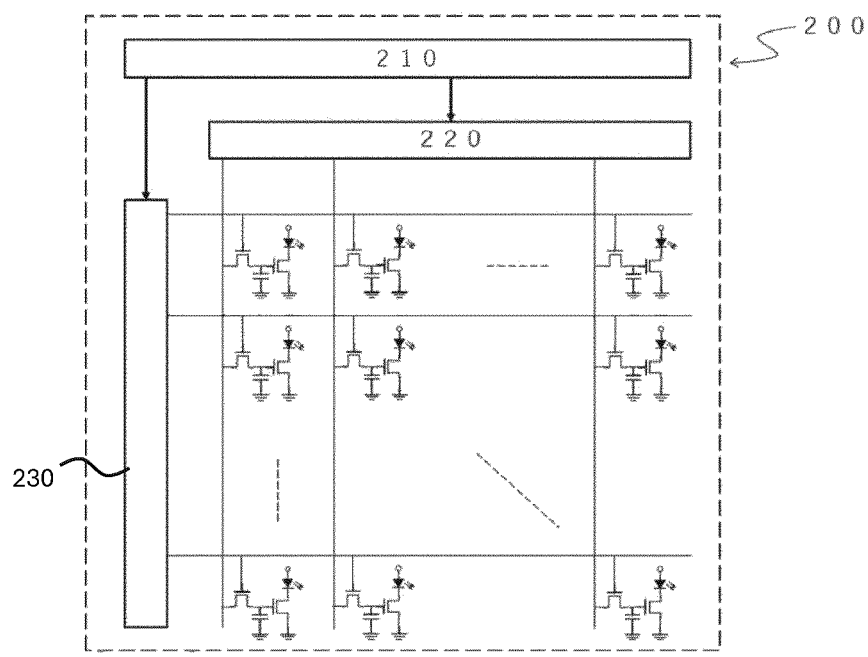
FIG. 15A is a schematic circuit diagram of a display device according to a fourth embodiment.
Figure 15B:
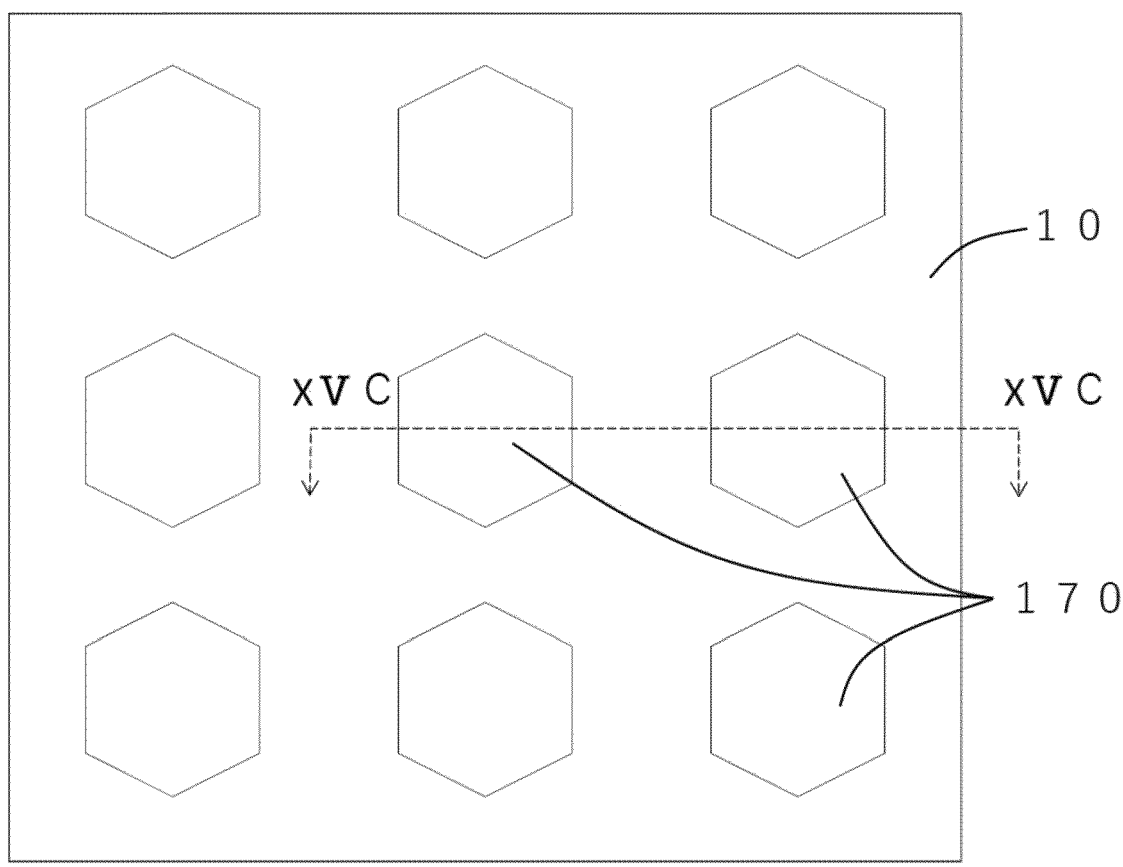
FIG. 15B is a partially-enlarged schematic plan view of the display device according to the fourth embodiment.
Figure 15C:
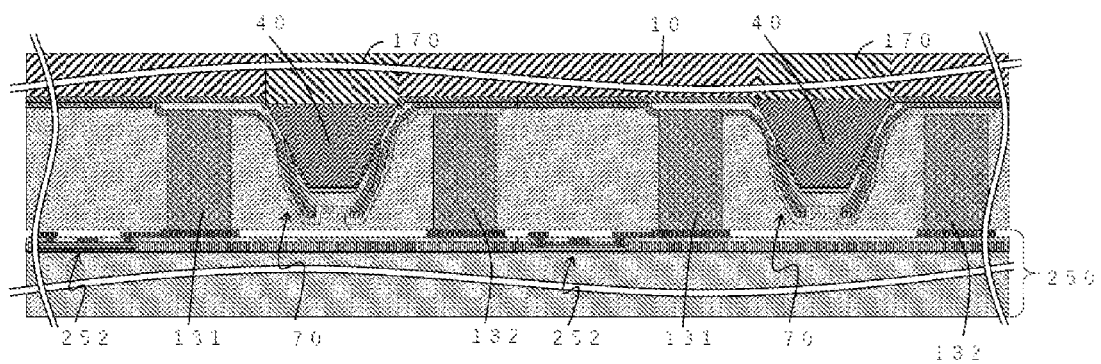
FIG. 15C is a schematic sectional view taken along line XVC-XVC in FIG. 15B.

The plurality of light-emitting devices are arranged in a matrix form as shown in FIG. 15B. The conductive pads of the TFT-attached wiring substrate 250 are bonded to the first metallic sections 131 and the second metallic sections 132 as shown in FIG. 15C. For the bonding, methods such as surface activated bonding, thermal compression bonding, solder bonding, and bonding by an adhesive can be used. By making an area of conductive surfaces of the first metallic section 131 and the second metallic section 132 larger than an area of the semiconductor stacked body 70 in a top view, positioning and bonding can be facilitated.

Furthermore, as shown in FIG. 15A, power lines (not shown), address lines, signal lines, and ground lines (not shown) of a column-direction drive circuit 220 and a row-direction drive circuit 230 connected to a video signal processing circuit 210 are respectively connected to anodes of light-emitting devices of the TFT-attached wiring substrate 250, gates of the TFT elements 252, sources of the TFT elements 252, drains of the TFT elements 252, and the like so that a display device 200 capable of individually controlling lighting of a plurality of light-emitting devices is made.

In the light-emitting device according to the present embodiment, the island shaped semiconductor stacked body 70 including the active layer 50 is covered by the second conductive layer 120, the first conductive layer 110 and the first resin layer 141, and a periphery of the wavelength-converting member 170 arranged on a light-exiting side of the light-emitting device is surrounded by the substrate 10 made of Si, which is a light-shielding member. Crosstalk between the island shaped semiconductor stacked body 70, which constitutes a light-emitting section, and an adjacent island shaped semiconductor stacked body 70, which also constitutes a light-emitting section, is prevented and a contrast ratio of the display device can be improved.

Because the semiconductor stacked body 70 is not disposed in a region where a conductive surface of a metallic section to be a bonded portion is arranged in a top view, heat and mechanical stress that are created during bonding to the conductive surface of the metallic section are less likely to be transmitted to the semiconductor stacked body 70. Therefore, degradation of the semiconductor stacked body 70 can be suppressed. As shown in FIG. 15B, the TFT elements 252 are disposed in a region excluding directly underneath the first metallic section 131 and the second metallic section 132. Accordingly, because the heat and mechanical stress that are created during bonding to the conductive surfaces of the metallic section are less likely to be transmitted to the TFT elements 252, degradation of the TFT elements 252 can be suppressed. While an example in which a plurality of light-emitting devices are simultaneously bonded to the TFT-attached wiring substrate 250 has been described in the fourth embodiment, the effect described above can also be produced when the plurality of light-emitting devices are bonded to the TFT-attached wiring substrate 250 at staggered times.

Fifth Embodiment

A display device that causes red light to be emitted from the opening 160 of the substrate 10 of the light-emitting device, a display device that causes green light to be emitted from the opening 160, and a display device that causes blue light to be emitted from the opening 160 are prepared by processes similar to those of the fourth embodiment. In addition, a projector is configured by combining these three types of display devices with collimator lenses, a dichroic prism, a projection lens, and the like.

According to the projector configured as described above, spread of emitted light is suppressed and, due to the use of display devices with small etendue, a projector with high light use efficiency can be realized.

What is claimed is:

1. A display device comprising:
   a mounting substrate;
   a plurality of light-emitting devices arranged on the mounting substrate; and
   a single crystal substrate having a plurality of openings;
   wherein the mounting substrate comprises:
   a plurality of thin-film transistor (TFT) elements, and
   a plurality of conductive pads, each of which is electrically connected to one of the plurality of TFT elements;
   wherein each of the plurality of light-emitting devices comprises:
   a semiconductor stacked body located below one of the openings,
   a first metallic section electrically connected to the semiconductor stacked body,
   a second metallic section electrically connected to the semiconductor stacked body,
   a first conductive layer comprising a semiconductor connecting section located between an outermost lateral surface of the semiconductor stacked body and a lateral surface of the first metallic section that faces the outermost lateral surface of the semiconductor stacked body, and
   a second conductive layer comprising an extended section located between the outermost lateral surface of the semiconductor stacked body and a lateral surface of the second metallic section that faces the outermost lateral surface of the semiconductor stacked body;
   wherein each of the semiconductor stacked bodies is disposed between a respective one of the first metallic sections and a respective one of the second metallic sections, and the plurality of conductive pads include:
   a plurality of first conductive pads, each electrically connected to the first metallic section of a respective one of the light-emitting devices, and
   a plurality of second conductive pads, each electrically connected to the second metallic section of the respective one of the light-emitting devices; and
   wherein the TFT elements are disposed in regions other than underneath the first metallic sections and the second metallic sections.

2. The display device according to claim 1, wherein:
   the semiconductor stacked bodies are disposed in regions other than above the plurality of TFT elements and the conductive pads.

3. The display device according to claim 1, wherein:
   an area of a conductive surface of each one of the first metallic sections and each one of the second metallic sections is larger than an area of a respective one of the semiconductor stacked bodies in a plan view.

4. The display device according to claim 2, wherein:
   an area of a conductive surface of each one of the first metallic sections and each one of the second metallic sections is larger than an area of a respective one of the semiconductor stacked bodies in a plan view.

5. The display device according to claim 1, further comprising:
   a plurality of wavelength-converting members, each disposed in one of the openings.

6. The display device according to claim 2, further comprising:
   a plurality of wavelength-converting members, each disposed in one of the openings.

7. The display device according to claim 3, further comprising:
   a plurality of wavelength-converting members, each disposed in one of the openings.

8. A projector comprising:
   a plurality of the display devices according to claim 1.

9. The display device according to claim 1, wherein:
   a lower surface of the first conductive layer of the each of the plurality of light-emitting devices contacts an upper surface of the first metallic section of the each of the plurality of light-emitting devices; and
   a lower surface of the second conductive layer of the each of the plurality of light-emitting devices contacts an upper surface of the second metallic section of the each of the plurality of light-emitting devices.

10. The display device according to claim 1, wherein:
    the semiconductor connecting section of the first conductive layer directly contacts the outermost lateral surface of the semiconductor stacked body so as to be electrically connected to the outermost lateral surface of the semiconductor stacked body.

11. The display device according to claim 10, wherein:
    the semiconductor connecting section of the first conductive layer continuously surrounds the outermost lateral surface of the semiconductor stacked body in a plan view.

12. The display device according to claim 1, wherein:
    a surface of the single crystal substrate is black.

13. The display device according to claim 1, wherein each of the plurality of light-emitting devices further comprises a third metallic section formed on the semiconductor stacked body as a heat radiation path from the semiconductor stacked body.

14. The display device according to claim 1, wherein a planar view each of the plurality of openings is a hexagonal shape.

* * * * *